United States Patent
Miura et al.

(10) Patent No.: US 12,362,221 B2
(45) Date of Patent: Jul. 15, 2025

(54) METHOD FOR MANUFACTURING ELECTRONIC DEVICE

(71) Applicant: RM TOHCELLO CO., LTD., Tokyo (JP)

(72) Inventors: Toru Miura, Nagoya (JP); Hiroyoshi Kurihara, Nagoya (JP)

(73) Assignee: MITSUI CHEMICALS ICT MATERIA, INC., Tokyo (JP)

( * ) Notice: Subject to any disclaimer, the term of this patent is extended or adjusted under 35 U.S.C. 154(b) by 281 days.

(21) Appl. No.: 17/906,638

(22) PCT Filed: Mar. 5, 2021

(86) PCT No.: PCT/JP2021/008786
§ 371 (c)(1),
(2) Date: Sep. 19, 2022

(87) PCT Pub. No.: WO2021/199919
PCT Pub. Date: Oct. 7, 2021

(65) Prior Publication Data
US 2023/0163014 A1 May 25, 2023

(30) Foreign Application Priority Data
Mar. 30, 2020 (JP) ................................. 2020-061027

(51) Int. Cl.
*H01L 21/683* (2006.01)
*C09J 7/24* (2018.01)
(Continued)

(52) U.S. Cl.
CPC .......... *H01L 21/6836* (2013.01); *C09J 7/245* (2018.01); *H01L 21/561* (2013.01);
(Continued)

(58) Field of Classification Search
CPC . H01L 21/6836; H01L 21/561; H01L 21/568; H01L 21/7806; H01L 2221/68327; C09J 7/245; C09J 2203/326
(Continued)

(56) References Cited

U.S. PATENT DOCUMENTS 11,398,389 B2   7/2022  Unezaki et al.
11,848,215 B2  12/2023  Igarshi et al.
(Continued)

FOREIGN PATENT DOCUMENTS

JP  2013157470 A   8/2013
KR  2019-0132385 A  11/2019
(Continued)

OTHER PUBLICATIONS

Extended European Search Report dated Apr. 3, 2024, issued by the European Patent Office in corresponding European Application No. 21780655.3-1212, (10 pages).
(Continued)

*Primary Examiner* — Joel W Fosselman
(74) *Attorney, Agent, or Firm* — BUCHANAN INGERSOLL & ROONEY PC

(57) ABSTRACT

A method for manufacturing an electronic device includes at least a preparing step of preparing a structure provided with an adhesive film provided with a base material layer, an adhesive resin layer (A) provided on a first surface side of the base material layer, an adhesive resin layer (B) provided on a second surface side of the base material layer, and an unevenness-absorbing resin layer (C) provided between the base material layer and the adhesive resin layer (A) or between the base material layer and the adhesive resin layer, and an electronic component attached to the adhesive resin layer (A) of the adhesive film and having an uneven structure, a cross-linking step of cross-linking the unevenness-
(Continued)

absorbing resin layer (C) by applying an external stimulus to the unevenness-absorbing resin layer (C) in the structure, and a sealing step of sealing the electronic component with a sealing material.

13 Claims, 4 Drawing Sheets

(51) Int. Cl.
*H01L 21/56* (2006.01)
*H01L 21/78* (2006.01)

(52) U.S. Cl.
CPC ........ *H01L 21/568* (2013.01); *H01L 21/7806* (2013.01); *C09J 2203/326* (2013.01); *H01L 2221/68327* (2013.01)

(58) Field of Classification Search
USPC .......................................... 348/343
See application file for complete search history.

(56) References Cited

U.S. PATENT DOCUMENTS

| | | |
|---|---|---|
| 2014/0231989 A1 | 8/2014 | Pagaila et al. |
| 2017/0032979 A1 | 2/2017 | Morita et al. |
| 2020/0219734 A1* | 7/2020 | Unezaki ............... H01L 21/6835 |
| 2021/0020461 A1* | 1/2021 | Igarashi ................ B32B 37/182 |

FOREIGN PATENT DOCUMENTS

| | | |
|---|---|---|
| WO | 2015098829 A1 | 7/2015 |
| WO | 2019017226 A1 | 1/2019 |
| WO | 2019188543 A1 | 10/2019 |

OTHER PUBLICATIONS

Office Action (Request for the Submission of an Opinion) issued on Oct. 14, 2024, by the Intellectual Property Office in corresponding Korean Patent Application No. 10-2022-7032143, and an English Translation of the Office Action. (19 pages).

* cited by examiner

METHOD FOR MANUFACTURING ELECTRONIC DEVICE

TECHNICAL FIELD

The present invention relates to a method for manufacturing an electronic device.

BACKGROUND ART

When manufacturing electronic devices (for example, semiconductor devices), electronic components such as semiconductor chips are usually covered by a sealing resin to form a sealing resin body. At this time, a step may be adopted in which the electronic components are covered by a sealing resin in a state where the electronic components are fixed on a support plate via a temporary fixing material.

Examples of techniques relating to such a method for manufacturing an electronic device include the technique described in Patent Document 1 (International Publication No. 2015/098829).

Patent Document 1 describes a method for manufacturing a semiconductor package including a step of pressing a laminate provided with a support plate, a chip temporary fixing body provided with a temporary fixing material laminated on the support plate and a semiconductor chip temporarily fixed on the temporary fixing material, a thermosetting resin sheet arranged on the above chip temporary fixing body, and a separator arranged on the thermosetting resin sheet having a tensile storage elastic modulus of 200 MPa or higher at 90° C., so as to form a sealed body provided with the semiconductor chip and the thermosetting resin sheet covering the semiconductor chip.

RELATED DOCUMENT

Patent Document

[Patent Document 1] International Publication No. 2015/098829

SUMMARY OF THE INVENTION

Technical Problem

According to studies by the inventors of the present invention, it was clear that, when electronic components having an uneven structure such as bumps, for example, are arranged on an adhesive film and the electronic components are sealed with a sealing material, the position of the electronic components may shift in the horizontal direction (also referred to below as position shifting of the electronic components) or the sealing material may penetrate between the adhesive film and the electronic component.

On the other hand, according to further studies by the inventors of the present invention, it was found that using an adhesive film provided with an unevenness-absorbing resin layer as the adhesive film makes it possible to suppress position shifting of electronic components in the sealing step and the penetration of the sealing material between the adhesive film and the electronic components.

However, as shown in FIGS. 4(a) to (c), it is clear that, when using an adhesive film 50A provided with an unevenness-absorbing resin layer, when arranging an electronic component 70A having an uneven structure 75A so as to seal the electronic component with a sealing material 60A, the unevenness-absorbing resin layer is softened by heat and the electronic component 70A easily sinks into the adhesive film 50A due to the pressure of the sealing material 60A and, as a result, as shown in FIG. 4(d), a sealing defect called a stand-off 90 may occur in the electronic component 70A.

The present invention is made in consideration of the above circumstances and provides a method for manufacturing an electronic device with which it is possible to suppress the occurrence of a sealing defect called a stand-off in an electronic component.

Solution to Problem

The inventors of the present invention carried out intensive studies in order to achieve the above object. As a result, it was found that using an adhesive film provided with an unevenness-absorbing resin layer, which is able to be cross-linked by an external stimulus, as an adhesive film, makes it possible to suppress the occurrence of a sealing defect called a stand-off in an electronic component, thereby completing the present invention.

According to the present invention, a method for manufacturing an electronic device illustrated below is provided.

[1]

A method for manufacturing an electronic device, the method including at least a preparing step of preparing a structure provided with an adhesive film provided with a base material layer, an adhesive resin layer (A) provided on a first surface side of the base material layer and used for temporarily fixing an electronic component, an adhesive resin layer (B) provided on a second surface side of the base material layer, and an unevenness-absorbing resin layer (C) provided between the base material layer and the adhesive resin layer (A) or between the base material layer and the adhesive resin layer (B), and which is able to be cross-linked by an external stimulus, and an electronic component attached to the adhesive resin layer (A) of the adhesive film and having an uneven structure, a cross-linking step of cross-linking the unevenness-absorbing resin layer (C) by applying an external stimulus to the unevenness-absorbing resin layer (C) in the structure, and a sealing step of sealing the electronic component with a sealing material.

[2]

The method for manufacturing an electronic device according to [1], in which the adhesive resin layer (B) is a layer for which an adhesive force is reduced by an external stimulus.

[3]

The method for manufacturing an electronic device according to [1] or [2], in which the external stimulus is heat or light.

[4]

The method for manufacturing an electronic device according to any one of [1] to [3], in which the unevenness-absorbing resin layer (C) is provided at least between the base material layer and the adhesive resin layer (A).

[5]

The method for manufacturing an electronic device according to any one of [1] to [4], in which the uneven structure of the electronic component includes a bump electrode.

[6]

The method for manufacturing an electronic device according to [5], in which, when a height of the bump electrode is H [μm] and a thickness of the unevenness-absorbing resin layer is d [μm], H/d is 0.01 or more and 1 or less.

[7]
The method for manufacturing an electronic device according to any one of [1] to [6], in which a storage elastic modulus E' of an unevenness-absorbing resin layer (C') obtained by cross-linking the unevenness-absorbing resin layer (C) at 125° C. is $1.0\times10^6$ Pa or higher and $1.0\times10^9$ Pa or lower.

[8]
The method for manufacturing an electronic device according to any one of [1] to [7], in which the unevenness-absorbing resin layer includes a cross-linkable resin.

[9]
The method for manufacturing an electronic device according to any one of [1] to [8], in which a thickness of the unevenness-absorbing resin layer is 10 μm or more and 1000 μm or less.

[10]
The method for manufacturing an electronic device according to any one of [1] to [9], in which the structure is further provided with a support substrate attached to the adhesive resin layer (B).

[11]
The method for manufacturing an electronic device according to [10], further including a first peeling step of peeling the support substrate from the structure by reducing an adhesive force of the adhesive resin layer (B) by applying an external stimulus, after the sealing step.

[12]
The method for manufacturing an electronic device according to [11], further including a second peeling step of peeling the adhesive film from the electronic component after the first peeling step.

[13]
The method for manufacturing an electronic device according to any one of [1] to [12], in which the sealing material is an epoxy resin-based sealing material.

[14]
The method for manufacturing an electronic device according to any one of [1] to [13], in which an adhesive resin forming the adhesive resin layer (A) includes one or two or more types selected from (meth)acrylic-based adhesive resin, silicone-based adhesive resin, urethane-based adhesive resin, olefin-based adhesive resin, and styrene-based adhesive resin.

[15]
A method for manufacturing an electronic device, the method including at least
a preparing step of preparing a structure provided with an adhesive film provided with a base material layer, an adhesive resin layer (A) provided on a first surface side of the base material layer and used for temporarily fixing an electronic component, and an unevenness-absorbing resin layer (C) provided between the base material layer and the adhesive resin layer (A) and which is able to be cross-linked by an external stimulus, and an electronic component attached to the adhesive resin layer (A) of the adhesive film and having an uneven structure,
a cross-linking step of cross-linking the unevenness-absorbing resin layer (C) by applying an external stimulus to the unevenness-absorbing resin layer (C) in the structure, and
a sealing step of sealing the electronic component with a sealing material.

Advantageous Effects of Invention

According to the present invention, it is possible to provide a method for manufacturing an electronic device with which it is possible to suppress the occurrence of a sealing defect called a stand-off in an electronic component.

DESCRIPTION OF EMBODIMENTS

Figure 1:
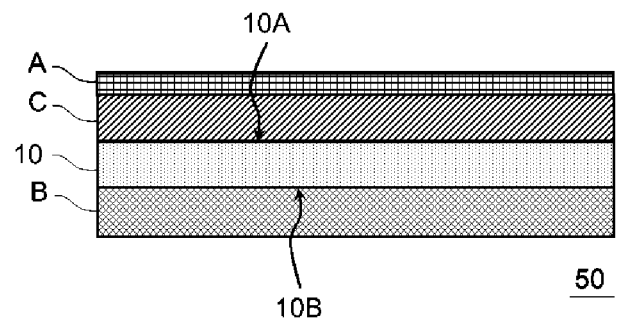
FIG. 1 is a cross-sectional view schematically showing an example of a structure of an adhesive film of an embodiment according to the present invention.

A description will be given below of embodiments of the present invention with reference to the drawings. In all the drawings, common reference numerals are given to the same constituent components and description thereof will not be repeated as appropriate. In addition, the figures are schematic views and do not match the actual dimensional ratios. In addition, unless otherwise specified, "A to B" in the numerical range represents A or more and B or less. In addition, in the present embodiment, "(meth)acrylic" means acrylic, methacrylic, or both acrylic and methacrylic.

1. Method for Manufacturing Electronic Device

Figure 2:
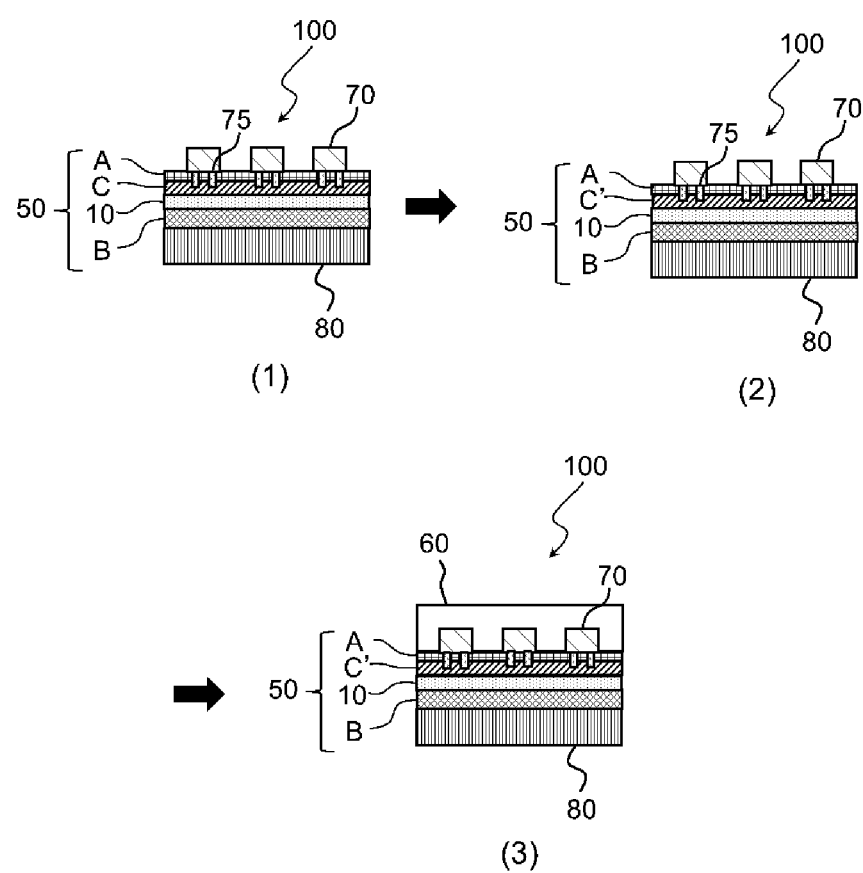
FIG. 2 is a cross-sectional view schematically showing an example of a method for manufacturing an electronic device of an embodiment according to the present invention.
Figure 3:
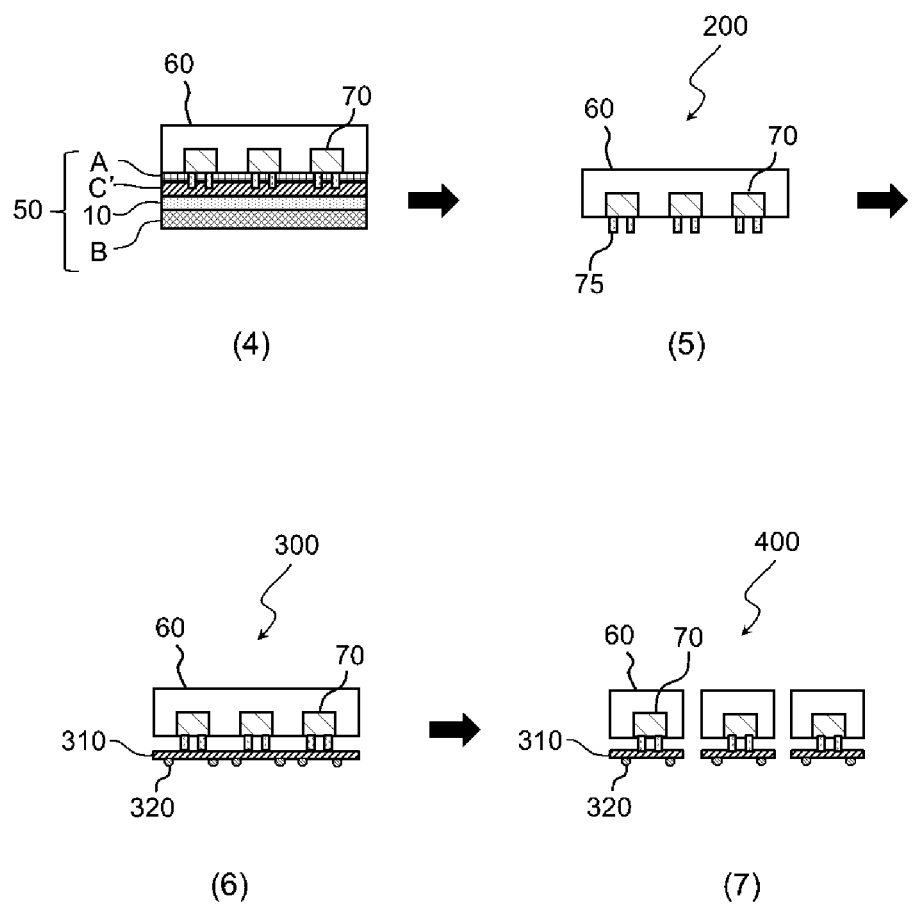
FIG. 3 is a cross-sectional view schematically showing an example of a method for manufacturing an electronic device of an embodiment according to the present invention.

First, a description will be given of the method for manufacturing an electronic device according to the present embodiment. FIG. 1 is a cross-sectional view schematically showing an example of the structure of an adhesive film 50 of the embodiment according to the present invention. FIGS. 2 and 3 are cross-sectional views schematically showing an example of a method for manufacturing an electronic device of an embodiment according to the present invention.

The method for manufacturing an electronic device according to the present embodiment is provided with at least the following three steps.

(1) A preparing step of preparing a structure 100 provided with the adhesive film 50 provided with a base material layer 10, an adhesive resin layer (A) provided on a first surface 10A side of the base material layer 10 and used for temporarily fixing an electronic component 70, an adhesive resin layer (B) provided on a second surface 10B side of the base material layer 10, and an unevenness-absorbing resin layer (C) provided between the base material layer 10 and the adhesive resin layer (A) or between the base material layer 10 and the adhesive resin layer (B), and which is able to be cross-linked by an external stimulus, and an electronic component 70 attached to the adhesive resin layer (A) of the adhesive film 50 and having an uneven structure 75.

(2) A cross-linking step of cross-linking the unevenness-absorbing resin layer (C) by applying an external stimulus to the unevenness-absorbing resin layer (C) in the structure 100.

(3) A sealing step of sealing the electronic component 70 with a sealing material 60.

Here, in a case where a chuck table or the like is used as the support substrate 80, for example, it is possible to fix the adhesive film 50 to the support substrate 80 even without the adhesive resin layer (B). Therefore, in the adhesive film 50, the adhesive resin layer (B) provided on the second surface 10B side of the base material layer 10 may not be provided.

As described above, according to studies by the inventors of the present invention, it was found that using an adhesive film provided with an unevenness-absorbing resin layer as an adhesive film makes it possible to suppress position shifting of electronic components in the sealing step and the penetration of the sealing material between the adhesive film and the electronic components.

Figure 4:
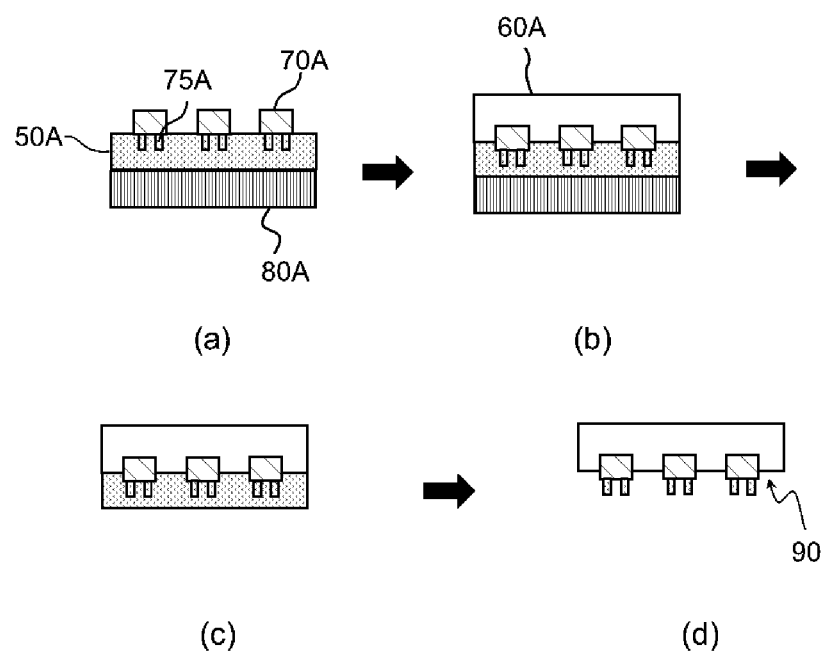
FIG. 4 is a diagram illustrating a sealing defect called a stand-off in an electronic component.

However, as shown in FIGS. 4(*a*) to (*c*), it is clear that, when using the adhesive film 50A provided with an unevenness-absorbing resin layer, when arranging the electronic component 70A having the uneven structure 75A so as to seal the electronic component with the sealing material 60A, the unevenness-absorbing resin layer is softened by heat and the electronic component 70A easily sinks into the adhesive film 50A due to the pressure of the sealing material 60A and, as a result, as shown in FIG. 4(*d*), a sealing defect called the stand-off 90 may occur in the electronic component 70A.

The inventors of the present invention carried out further intensive studies in order to realize a method for manufacturing an electronic device with which it is possible to suppress position shifting of electronic components in the sealing step and the penetration of the sealing material between the adhesive film and the electronic components, as well as to suppress the occurrence of a stand-off in the sealing step. As a result, it was found for the first time that, by using the adhesive film 50 provided with the base material layer 10, an adhesive resin layer (A) provided on the first surface 10A side of the base material layer 10 and used for temporarily fixing an electronic component, an adhesive resin layer (B) provided on the second surface 10B side of the base material layer 10, and an unevenness-absorbing resin layer (C) provided between the base material layer 10 and the adhesive resin layer (A) or between the base material layer 10 and the adhesive resin layer (B), and which is able to be cross-linked by an external stimulus, it is possible to suppress position shifting of electronic components in the sealing step and the penetration of the sealing material between the adhesive film and the electronic components, as well as to suppress the occurrence of a stand-off in the sealing step.

That is, according to the present embodiment, by using the adhesive film 50 having the unevenness-absorbing resin layer (C) which is able to be cross-linked by an external stimulus as an adhesive film used for temporarily fixing the electronic component having the uneven structure, the adhesion of the adhesive film 50 with respect to the electronic component having the uneven structure is improved, thus, in the step of sealing the electronic component, it is possible to suppress the position of the electronic component from shifting due to pressure or the like caused by the flow of the sealing material or the sealing material from penetrating between the adhesive film and the electronic component. Furthermore, by increasing the elastic modulus by cross-linking and curing the unevenness-absorbing resin layer (C) by an external stimulus after temporarily fixing the electronic component having an uneven structure, it is possible to suppress the electronic component from sinking into the adhesive film in the electronic component sealing step.

As described above, according to the method for manufacturing an electronic device according to the present embodiment, it is possible to suppress position shifting of electronic components in the sealing step and the penetration of the sealing material between the adhesive film and the electronic components, as well as to suppress the occurrence of a stand-off in the sealing step.

A description will be given below of each step of the method for manufacturing an electronic device according to the present embodiment.

(1) Preparing Step

In the preparing step, the structure 100 provided with the adhesive film 50 and the electronic component 70 attached to the adhesive resin layer (A) of the adhesive film 50 and having the uneven structure 75 is prepared. Here, the structure 100 may be further provided with the support substrate 80 attached to the adhesive resin layer (B) of the adhesive film 50.

It is possible to manufacture the structure 100, for example, by the following procedure.

First, the adhesive film 50 is attached on the support substrate 80 such that the adhesive resin layer (B) is on the support substrate 80 side. A protective film called a separator may be attached on the adhesive resin layer (B) and it is possible to peel the protective film and attach the exposed surface of the adhesive resin layer (B) to the surface of the support substrate 80.

As the support substrate 80, for example, it is possible to use a quartz substrate, a glass substrate, a SUS substrate, or the like.

Next, it is possible to obtain the structure 100 by arranging the electronic component 70 on the adhesive resin layer (A) of the adhesive film 50.

Examples of the electronic component 70 include a semiconductor chip such as an IC, LSI, discrete component, light emitting diode, or light receiving element, a semiconductor panel, a semiconductor package, and the like.

The surface of the electronic component 70 has the uneven structure 75, for example, by having electrodes.

In addition, the electrodes are, for example, bonded with respect to the electrodes formed on the mounting surface when the electronic device is mounted on the mounting surface, so as to form an electrical connection between the electronic device and the mounting surface (mounting surface of a printed substrate or the like).

Examples of electrodes include bump electrodes such as ball bumps, printing bumps, stud bumps, plating bumps, pillar bumps, and the like. That is, the electrode is usually a convex electrode. These bump electrodes may be used alone as one type or two or more types may be used in combination.

In addition, the type of the metal forming the bump electrode is not particularly limited and examples thereof include silver, gold, copper, tin, lead, bismuth, alloys thereof, and the like. These metal types may be used alone as one type or two or more types may be used in combination.

(2) Cross-Linking Step

Next, the unevenness-absorbing resin layer (C) in the structure 100 is cross-linked by applying an external stimulus to the unevenness-absorbing resin layer (C).

The method for thermal cross-linking the unevenness-absorbing resin layer (C) is not particularly limited as long as it is a method with which it is possible to thermally cure the cross-linkable resin and examples thereof include thermal cross-linking by a radical polymerization initiator.

For thermal cross-linking by a radical polymerization initiator, it is possible to use radical polymerization initiators used for cross-linking cross-linkable resins. As a radical polymerization initiator, it is possible to use known thermal radical polymerization initiators.

In a case of thermal cross-linking by a radical polymerization initiator, the heating temperature is, for example, 80° C. to 150° C. and the heating treatment time is, for example, 5 to 120 minutes.

In addition, it is possible to cross-link and cure the unevenness-absorbing resin layer (C) by irradiating the unevenness-absorbing resin layer (C) with light such as ultraviolet rays.

In a case of ultraviolet cross-linking, for example, it is possible to cross-link and cure the unevenness-absorbing resin layer (C) by irradiating the unevenness-absorbing resin layer (C) with ultraviolet rays with a main wavelength of 365 nm using a high-pressure mercury lamp in an environment of 0 to 100° C. under conditions of an irradiation intensity of 1 to 50 mW/cm$^2$ and an ultraviolet ray dose of 100 to 10,000 mJ/cm$^2$.

In addition, in any of the cross-linking methods, the cross-linking of the unevenness-absorbing resin layer (C) may be performed by blending a cross-linking aid in the unevenness-absorbing resin layer (C).

(3) Sealing Step

Next, the electronic component 70 is sealed with the sealing material 60.

The electronic component 70 is covered by the sealing material 60 and the sealing material 60 is cured at, for example, a temperature of 150° C. or lower to seal the electronic component 70. Here, in a case where the adhesive resin layer (B) of the adhesive film 50 includes at least one selected from gas generating components and heat-expandable microspheres, the curing temperature of the sealing material 60 is preferably in a range not exceeding the temperature at which gas is generated or the temperature at which the heat-expandable microspheres undergo heat expansion.

In addition, the form of the sealing material 60 is not particularly limited, but is, for example, granular, sheet-like, or liquid-like.

The sealing material 60 is not particularly limited, but, for example, it is possible to use an epoxy resin-based sealing material using an epoxy resin.

In particular, a liquid-like epoxy resin-based sealing material is preferable in terms of the affinity of the sealing material 60 to the adhesive film 50 being more favorable and being able to seal the electronic component 70 more evenly.

As such an epoxy resin-based sealing material, for example, it is possible to use the T693/R4000 series, the T693/R1000 series, the T693/R5000 series, and the like, manufactured by Nagase ChemteX Corporation.

Examples of sealing methods include transfer molding, injection molding, compression molding, casting molding, and the like. After sealing the electronic component 70 with the sealing material 60, the sealing material 60 is cured by heating at, for example, a temperature of 150° C. or lower to obtain the structure 100 in which the electronic component 70 is sealed.

(4) First Peeling Step

In the method for manufacturing an electronic device according to the present embodiment, as shown in FIG. 3 (4), after the sealing step of (3), a first peeling step of peeling the support substrate 80 from the structure 100 by reducing the adhesive force of the adhesive resin layer (B) by applying an external stimulus thereto may be further provided.

It is possible to easily remove the support substrate 80 from the adhesive film 50 by, for example, sealing the electronic components 70 and then heating at a temperature over 150° C. to reduce the adhesive force of the adhesive resin layer (B).

(5) Second Peeling Step

In the method for manufacturing an electronic device according to the present embodiment, as shown in FIG. 3 (5), after the first peeling step, a second peeling step of peeling the adhesive film 50 from the electronic component 70 to obtain an electronic device 200 may be further provided.

Examples of the method for peeling the adhesive film 50 from the electronic component 70 include a mechanical peeling method, a method of peeling after reducing the adhesive force on the surface of the adhesive film 50, or the like.

Other Steps

In the method for manufacturing an electronic device according to the present embodiment, as shown in FIG. 3 (6), a step (6) of forming a wiring layer 310 and bumps 320 on the exposed surface of the obtained electronic device 200 to obtain an electronic device 300 may be further provided.

The wiring layer 310 is provided with pads (not shown), which are external connection terminals formed on the outermost surface, and wiring (not shown), which electrically connects the exposed electronic component 70 to the pads. The wiring layer 310 is able to be formed by methods known in the related art and may be a multilayer structure.

Then, it is possible to form the bumps 320 on the pads of the wiring layer 310 and obtain the electronic device 300. Examples of the bumps 320 include solder bumps, gold bumps, or the like. It is possible to form solder bumps, for example, by arranging a solder ball on the pad, which is an external connection terminal of the wiring layer 310, and heating and melting (reflowing) the solder. It is possible to form gold bumps by methods such as a ball bonding method, a plating method, and an Au ball transfer method.

In addition, in the method for manufacturing an electronic device according to the present embodiment, as shown in FIG. 3 (7), a step (7) of dicing the electronic device 300 to obtain a plurality of electronic devices 400 may be further provided.

It is possible to perform the dicing of the electronic device 300 by a known method.

2. Adhesive Film

A description will be given below of the adhesive film 50 according to the present embodiment.

FIG. 1 is a cross-sectional view schematically showing an example of the structure of the adhesive film 50 of the embodiment according to the present invention.

As shown in FIG. 1, the adhesive film 50 according to the present embodiment is provided with the base material layer 10, the adhesive resin layer (A) provided on the first surface 10A side of the base material layer 10 and used for temporarily fixing the electronic component, the adhesive resin layer (B) provided on the second surface 10B side of the base material layer 10, and the unevenness-absorbing resin layer (C) provided between the base material layer 10 and the adhesive resin layer (A) or between the base material layer 10 and the adhesive resin layer (B) and which is able to be cross-linked by an external stimulus.

From the viewpoint of making the unevenness-absorbing property of the adhesive film 50 more favorable, the unevenness-absorbing resin layer (C) is preferably positioned at least between the base material layer 10 and the adhesive resin layer (A).

In a case where the unevenness-absorbing resin layer (C) is positioned between the base material layer 10 and the adhesive resin layer (A), another unevenness-absorbing resin layer (C2) may be further provided between the adhesive resin layer (B) and the base material layer 10, and, in this case, the unevenness-absorbing resin layer (C) and the unevenness-absorbing resin layer (C2) may be similar or different in material, thickness, and the like.

From the viewpoint of the balance between mechanical properties and handleability, the total thickness of the adhesive film 50 according to the present embodiment is preferably 10 μm or more and 1000 μm or less, and more preferably 20 μm or more and 500 μm or less.

Next, a description will be given of each layer forming the adhesive film 50 according to the present embodiment.

Base Material Layer

The base material layer 10 is a layer provided for the purpose of making the characteristics such as the handling, mechanical properties, heat resistance, and the like of the adhesive film 50 more favorable.

The base material layer 10 is not particularly limited and examples thereof include a resin film.

As the resin forming the resin film described above, it is possible to use a known thermoplastic resin. Examples thereof include one type or two or more types selected from polyolefins such as polyethylene, polypropylene, poly(4-methyl-1-pentene), and poly(1-butene); polyesters such as polyethylene terephthalate, polybutylene terephthalate, and polyethylene naphthalate; polyamides such as nylon-6, nylon-66, and polymetaxylene adipamide; polyacrylates; polymethacrylates; polyvinyl chlorides; polyvinylidene chlorides; polyimides; polyetherimides; ethylene vinyl acetate copolymers; polyacrylonitrile; polycarbonates; polystyrenes; ionomers; polysulfones; polyethersulfone; polyphenylene ether, and the like.

Among these, from the viewpoint of an excellent balance between the transparency, mechanical strength, price, and the like, one type or two or more types selected from polypropylene, polyethylene terephthalate, polyethylene naphthalate, polyamide, and polyimide are preferable, and at least one type selected from polyethylene terephthalate and polyethylene naphthalate is more preferable.

The base material layer 10 may be a single layer or a layer of two or more types.

In addition, the form of the resin film used to form the base material layer 10 may be a stretched film or a film stretched in the uniaxial or biaxial direction; however, from the viewpoint of improving the mechanical strength of the base material layer 10, a film stretched in the uniaxial or biaxial direction is preferable.

From the viewpoint of obtaining favorable film properties, the thickness of the base material layer 10 is preferably 1 μm or more and 500 μm or less, more preferably 5 μm or more and 300 μm or less, and even more preferably 10 μm or more and 250 μm or less.

The base material layer 10 may be subjected to a surface treatment in order to improve the adhesion with other layers. Specifically, a corona treatment, a plasma treatment, an undercoat treatment, a primer coat treatment, and the like may be performed.

Adhesive Resin Layer (A)

The adhesive resin layer (A) is a layer provided on one surface side of the base material layer 10, for example, for contacting the surface of the electronic component to temporarily fix the electronic component when the electronic component is sealed with a sealing material in the electronic device manufacturing steps.

The adhesive resin layer (A) includes an adhesive resin (A1).

Examples of the adhesive resin (A1) include a (meth)acrylic-based adhesive resin (a), a silicone-based adhesive resin, a urethane-based adhesive resin, an olefin-based adhesive resin, a styrene-based adhesive resin, and the like.

Among the above, the (meth)acrylic-based adhesive resin (a) is preferable from the viewpoint of facilitating the adjustment of the adhesive force and the like.

As the adhesive resin layer (A), it is also possible to use a radiation cross-linking adhesive resin layer in which the adhesive force is reduced by radiation. The radiation cross-linking adhesive resin layer is cross-linked by the irradiation of radiation and the adhesive force is significantly reduced, thus, the adhesive film 50 is easily peeled from the electronic component. Examples of the radiation include ultraviolet rays, electron beams, infrared rays, and the like.

As the radiation cross-linking adhesive resin layer, an ultraviolet cross-linking adhesive resin layer is preferable.

Examples of the (meth)acrylic-based adhesive resin (a) used in the adhesive resin layer (A) include a copolymer including a (meth)acrylic acid alkyl ester monomer unit (a1) and a monomer unit (a2) having a functional group capable of reacting with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (a) according to the present embodiment, for example, by copolymerizing a monomer mixture including a (meth)acrylic acid alkyl ester monomer (a1) and a monomer (a2) having a functional group capable of reacting with a cross-linking agent.

Examples of the monomer (a1) forming the (meth)acrylic acid alkyl ester monomer unit (a1) include a (meth)acrylic acid alkyl ester having an alkyl group having approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types.

In the (meth)acrylic-based adhesive resin (a) according to the present embodiment, when the total of all the monomer units in the (meth)acrylic-based adhesive resin (a) is 100% by mass, the content of the (meth)acrylic acid alkyl ester monomer unit (a1) is preferably 10% by mass or more and 98.9% by mass or less, more preferably 50% by mass or more and 97% by mass or less, and even more preferably 85% by mass or more and 95% by mass or less.

Examples of the monomer (a2) forming the monomer (a2) having a functional group capable of reacting with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, and the like. Preferable are acrylic acid, methacrylic acid, 2-hydroxyethyl acrylate, 2-hydroxyethyl methacrylate, acrylamide, methacrylamide, and the like. These may be used alone or in a combination of two or more types.

In the (meth)acrylic-based adhesive resin (a) according to the present embodiment, when the total of all the monomer units in the (meth)acrylic-based adhesive resin (a) is 100% by mass, the content of the monomer unit (a2) is preferably 1% by mass or more and 40% by mass or less, more preferably 1% by mass or more and 20% by mass or less, and even more preferably 1% by mass or more and 10% by mass or less.

The (meth)acrylic-based adhesive resin (a) according to the present embodiment may, in addition to the monomer unit (a1) and the monomer unit (a2), further include a bifunctional monomer unit (a3) and a specific comonomer (referred to below as a polymerizable surfactant) unit having properties as a surfactant.

The polymerizable surfactant has a property of copolymerizing with the monomer (a1), the monomer (a2), and the monomer (a3), and also has an action as an emulsifier in the case of emulsion polymerization.

Examples of the monomer (a3) forming the bifunctional monomer unit (a3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or, for example, monomers in which the main chain structure is a propylene glycol type with diacrylate or dimethacrylate at both ends (for example, manufactured by NOF Corp., trade name: PDP-200, PDP-400, ADP-200, and ADP-400), tetramethylene glycol type monomers (for example, manufactured by NOF Corp., trade name: ADT-250 and ADT-850), mixtures thereof (for example, manufactured by NOF Corp., trade name: ADET-1800 and ADPT-4000), and the like.

In the (meth)acrylic-based adhesive resin (a) according to the present embodiment, when the total of all the monomer units in the (meth)acrylic-based adhesive resin (a) is 100% by mass, the content of the monomer unit (a3) is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (a) according to the present embodiment, when the total of all monomer units in the (meth)acrylic-based adhesive resin (a) is 100% by mass, the content of the polymerizable surfactant is preferably 0.1% by mass or more and 30% by mass or less, more preferably 0.1% by mass or more and 15% by mass or less, even more preferably 0.1% by mass or more and 20% by mass or less, and particularly preferably 0.1% by mass or more and 5% by mass or less.

The (meth)acrylic-based adhesive resin (a) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (a) according to the present embodiment include radical polymerization, anionic polymerization, cationic polymerization, and the like. In consideration of the manufacturing cost of the (meth)acrylic-based adhesive resin (a), the influence of the functional group of the monomer, the influence of ions on the surface of the electronic component, and the like, it is preferable to carry out the polymerization by radical polymerization.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (A) according to the present embodiment preferably further includes a cross-linking agent (A2) having two or more cross-linkable functional groups in one molecule, in addition to the adhesive resin (A1).

The cross-linking agent (A2) having two or more cross-linkable functional groups in one molecule is used to react with the functional group of the adhesive resin (A1) and adjust the adhesive force and cohesion force.

Examples of such a cross-linking agent (A2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcin diglycidyl ether; isocyanate-based compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine-based compounds such as trimethylolpropane-tri-β-aziridinylpropionate, tetramethylolmethane-tri-β-aziridinylpropionate, N,N'-diphenylmethane-4,4'-bis(1-aziridinecarboxamide), N,N'-hexamethylene-1,6-bis(1-aziridinecarboxamide), N,N'-toluene-2,4-bis(1-aziridinecarboxamide), and trimethylolpropane-tri-β-(2-methylaziridine) propionate; tetrafunctional epoxy-based compounds such as N,N,N',N'-tetraglycidyl-m-xylenediamine and 1,3-bis(N,N'-diglycidylaminomethyl) cyclohexane; and melamine-based compounds such as hexamethoxymethylolmelamine. These may be used alone or in a combination of two or more types.

Among the above, it is preferable to include one type or two or more types selected from an epoxy-based compound, an isocyanate-based compound, and an aziridine-based compound.

The content of the cross-linking agent (A2) is usually preferably in a range in which the number of functional groups in the cross-linking agent (A2) does not exceed the number of functional groups in the adhesive resin (A1). However, in a case where a functional group is newly generated in the cross-linking reaction, a case where the cross-linking reaction is slow, or the like, the content thereof may be greater as necessary.

From the viewpoint of improving the balance between the heat resistance and the adhesive force of the adhesive resin layer (A), the content of the cross-linking agent (A2) in the adhesive resin layer (A) is preferably 0.1 parts by mass or more and 15 parts by mass or less with respect to 100 parts by mass of the adhesive resin (A1).

The adhesive resin layer (A) may include additives such as plasticizers and adhesion-imparting resins as other components. In a case where the adhesive resin layer (A) is a radiation cross-linking adhesive resin layer, various additives for radiation cross-linking may be included. The total content of the adhesive resin (A1) and the cross-linking agent (A2) in the adhesive resin layer (A) is preferably 50% by mass or more when the entire adhesive resin layer (A) is 100% by mass, more preferably 70% by mass or more, even more preferably 90% by mass or more, and particularly preferably 95% by mass or more. Due to this, it is possible to further suppress glue residue on the electronic component side when the adhesive film is peeled from the electronic component.

The thickness of the adhesive resin layer (A) is not particularly limited, but is, for example, preferably 1 μm or more and 100 μm or less, and more preferably 3 μm or more and 50 μm or less.

It is possible to form the adhesive resin layer (A), for example, by coating an adhesive on the base material layer 10 or the unevenness-absorbing resin layer (C). The adhesive may be dissolved in a solvent and coated as a coating solution, coated as an aqueous emulsion, or directly coated as a liquid-like adhesive.

Among the above, an aqueous emulsion coating solution is preferable. Examples of aqueous emulsion coating solutions include a coating solution in which the (meth)acrylic-based adhesive resin (a), a silicone-based adhesive resin, a urethane-based adhesive resin, an olefin-based adhesive resin, a styrene-based adhesive resin, or the like is dispersed in water.

An adhesive coating solution dissolved in an organic solvent may be used. The organic solvent is not particularly limited and may be appropriately selected from known organic solvents in consideration of solubility and drying time. Examples of organic solvents include ester-based organic solvents such as ethyl acetate and methyl acetate; ketone-based organic solvents such as acetone and MEK; aromatic-based organic solvents such as benzene, toluene, and ethylbenzene; linear or cyclic aliphatic-based organic solvents such as heptane, hexane, and cyclohexane; and alcohol-based organic solvents such as isopropanol and butanol. Ethyl acetate and toluene are preferable as the organic solvent. These solvents may be used alone as one type or used in a mixture of two or more types.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (A) or the unevenness-absorbing resin layer (C) may be formed by coextrusion molding, or the film-like base material layer 10 and the film-like adhesive resin layer (A) may be formed by laminating.

Adhesive Resin Layer (B)

The adhesive film 50 according to the present embodiment is provided with the adhesive resin layer (B) on the second surface 10B side on the opposite side to the first surface 10A of the base material layer 10.

The adhesive resin layer (B) is preferably a layer for which the adhesive force is reduced by an external stimulus. Due to this, it is possible to easily peel the adhesive film 50 from the support substrate by applying an external stimulus.

Here, examples of the adhesive resin layer (B), the adhesive force of which is reduced by an external stimulus, include a heat-peelable adhesive resin layer, the adhesive force of which is reduced by heating, a light-peelable adhesive resin layer, the adhesive force of which is reduced by light such as radiation, and the like. Among the above, a heat-peelable adhesive resin layer, the adhesive force of which is reduced by heating, is preferable.

Examples of the heat-peelable adhesive resin layer include adhesive resin layers formed of a heat-expandable adhesive including a gas generating component, a heat-expandable adhesive including heat-expandable microspheres capable of expanding to reduce the adhesive force, a heat-expandable adhesive, the adhesive force of which is reduced by the cross-linking reaction of the adhesive components by heat, or the like.

In the present embodiment, the heat-expandable adhesive used in the adhesive resin layer (B) is an adhesive, the adhesive force of which is reduced or lost by heating at a temperature over 150° C., for example. For example, it is possible to select a material which does not peel at a temperature of 150° C. or lower and which does peel at a temperature over 150° C. and which preferably has an adhesive force such that the adhesive film 50 does not peel from the support substrate during the electronic device manufacturing steps.

Here, it is possible to evaluate the reduction or loss of the adhesive force by heating at a temperature over 150° C., for example, by the peeling strength from a stainless-steel plate, measured after attaching the adhesive resin layer (B) side to the stainless-steel plate, performing a heating treatment at 140° C. for one hour, and then heating at a temperature over 150° C. for two minutes. The specific heating temperature when heating at a temperature over 150° C. is set to a temperature higher than the temperature at which gas is generated or the temperature at which heat-expandable microspheres undergo heat expansion and is set as appropriate depending on the type of gas to be generated or the heat-expandable microspheres. In the present embodiment, loss of adhesive force means, for example, a case where the 180° peeling strength measured under conditions of 23° C. and a tensile speed of 300 mm/min is less than 0.5 N/25 mm.

As the gas generating component used in the heat-expandable adhesive, for example, it is possible to use an azo compound, an azide compound, a Meldrum's acid derivative, or the like. In addition, it is also possible to use inorganic foaming agents such as ammonium carbonate, ammonium hydrogen carbonate, sodium hydrogen carbonate, ammonium nitrite, sodium borohydride, and various azides, or organic foaming agents such as water; chlorofluoroalkane-based compounds such as trichloromonofluoromethane and dichloromonofluoromethane; azo-based compounds such as azobisisobutyronitrile, azodicarbonamide, and barium azodicarboxylate; hydrazine-based compounds such as paratoluenesulfonyl hydrazide, diphenylsulfone-3,3'-disulfonylhydrazide, 4,4'-oxybis(benzenesulfonyl hydrazide) and allylbis(sulfonylhydrazide); semicarbazide-based compounds such as p-toluylenesulfonyl semicarbazide, and 4,4'-oxybis(benzenesulfonyl semicarbazide); triazole-based compounds such as 5-morpholyl-1,2,3,4-thiatriazole; N-nitroso compounds such as N,N'-dinitrosopentamethylenetetramine, and N,N'-dimethyl-N,N'-dinitrosoterephthalamide, and the like. The gas generating component may be added to the adhesive resin (B1) or may be directly bonded to the adhesive resin (B1).

As the heat-expandable microspheres used for the heat-expandable adhesive, for example, it is possible to use a microencapsulated foaming agent. Examples of such heat-expandable microspheres include microspheres in which a substance that is easily gasified and expanded by heating such as isobutane, propane, and pentane is sealed in a shell having elasticity, or the like. Examples of the material forming the shell include vinylidene chloride-acrylonitrile copolymer, polyvinyl alcohol, polyvinyl butyral, polymethyl methacrylate, polyacrylonitrile, polyvinylidene chloride, polysulfone, and the like. It is possible to manufacture heat-expandable microspheres by, for example, a coacervation method, an interfacial polymerization method, or the like.

It is possible to add heat-expandable microspheres to the adhesive resin.

It is possible to appropriately set the content of at least one type selected from the gas generating component and the heat-expandable microspheres according to the expansion ratio and the reduction in adhesive force of the heat-peelable adhesive resin layer (B) and the like without being particularly limited; however, for example, with respect to 100 parts by mass of the adhesive resin (B1) in the heat-peelable adhesive resin layer (B), the content is, for instance, 1 part by mass or more and 150 parts by mass or less, preferably 10 parts by mass or more and 130 parts by mass or less, and more preferably 12 parts by mass or more and 100 parts by mass or less.

It is preferable to implement the design such that the temperature at which gas is generated or the temperature at which the heat-expandable microspheres heat-expand is over 150° C.

Examples of the adhesive resin (B1) forming the heat-expandable adhesive include a (meth)acrylic-based resin (b), a urethane-based resin, a silicone-based resin, a polyolefin-based resin, a polyester-based resin, a polyamide-based resin, a fluorine-based resin, a styrene-diene block copolymer-based resin, and the like. Among these, the (meth)acrylic-based resin (b) is preferable.

Examples of the (meth)acrylic-based adhesive resin (b) used for the adhesive resin layer (B) include a copolymer including a (meth)acrylic acid alkyl ester monomer unit (b1) and a monomer unit (b2) having a functional group able to react with a cross-linking agent.

In the present embodiment, the (meth)acrylic acid alkyl ester means an acrylic acid alkyl ester, a methacrylic acid alkyl ester, or a mixture thereof.

It is possible to obtain the (meth)acrylic-based adhesive resin (b) according to the present embodiment, for example, by copolymerizing a monomer mixture including a (meth)acrylic acid alkyl ester monomer (b1) and a monomer (b2) having a functional group able to react with a cross-linking agent.

Examples of the monomer (b1) forming the (meth)acrylic acid alkyl ester monomer unit (b1) include (meth)acrylic acid alkyl esters having an alkyl group of approximately 1 to 12 carbon atoms. A (meth)acrylic acid alkyl ester having an alkyl group having 1 to 8 carbon atoms is preferable. Specific examples thereof include methyl acrylate, methyl methacrylate, ethyl acrylate, ethyl methacrylate, butyl acrylate, butyl methacrylate, 2-ethylhexyl acrylate, 2-ethylhexyl methacrylate, and the like. These may be used alone or in a combination of two or more types.

In the (meth)acrylic-based adhesive resin (b) according to the present embodiment, the content of the (meth)acrylic acid alkyl ester monomer unit (b1) is preferably 10% by mass or more and 98.9% by mass or less when the total of all monomer units in the (meth)acrylic-based adhesive resin (b) is 100% by mass, more preferably 50% by mass or more and 97% by mass or less, and even more preferably 85% by mass or more and 95% by mass or less.

Examples of the monomers (b2) forming the monomer (b2) having a functional group able to react with the cross-linking agent include acrylic acid, methacrylic acid, itaconic acid, mesaconic acid, citraconic acid, fumaric acid, maleic acid, itaconic acid monoalkyl ester, mesaconic acid monoalkyl ester, citraconic acid monoalkyl ester, fumaric acid monoalkyl ester, maleic acid monoalkyl ester, glycidyl acrylate, glycidyl methacrylate, 2-hydroxyethyl acrylate, 2-hydroxyethyl methacrylate, acrylamide, methacrylamide, tert-butylaminoethyl acrylate, tert-butylaminoethyl methacrylate, and the like. Acrylic acid, methacrylic acid, 2-hydroxyethyl acrylate, 2-hydroxyethyl methacrylate, acrylamide, methacrylamide, and the like are preferable. These may be used alone or in a combination of two or more types.

In the (meth)acrylic-based adhesive resin (b) according to the present embodiment, the content of the monomer unit (b2) is preferably 1% by mass or more and 40% by mass or less when the total of all monomer units in the (meth)acrylic-based adhesive resin (b) is 100% by mass, more preferably 1% by mass or more and 20% by mass or less, and even more preferably 1% by mass or more and 10% by mass or less.

The (meth)acrylic-based adhesive resin (b) according to the present embodiment may further include, in addition to the monomer unit (b1) and the monomer unit (b2), a bifunctional monomer unit (b3) and a specific comonomer (referred to below as a polymerizable surfactant) unit having properties as a surfactant.

The polymerizable surfactant has a property of copolymerizing with monomer (b1), monomer (b2), and monomer (b3) and also acts as an emulsifier in a case where emulsion polymerization is performed.

Examples of the monomers (b3) forming the bifunctional monomer units (b3) include allyl methacrylate, allyl acrylate, divinylbenzene, vinyl methacrylate, vinyl acrylate, trimethylolpropane tri(meth)acrylate, pentaerythritol tri(meth)acrylate, dipentaerythritol hexa(meth)acrylate, tetraethylene glycol di(meth)acrylate, or examples in which the structure of the main chain is a propylene glycol-type with diacrylate or dimethacrylate at both ends (for example, manufactured by NOF Corp.; trade name: PDP-200, PDP-400, ADP-200, and ADP-400), tetramethylene glycol type examples (for example, manufactured by NOF Corp.; trade name: ADT-250 and ADT-850), and mixed types thereof (for example, manufactured by NOF Corp.; trade name: ADET-1800 and ADPT-4000).

In the (meth)acrylic-based adhesive resin (b) according to the present embodiment, the content of the monomer unit (b3) is preferably 0.1% by mass or more and 30% by mass or less when the total of all monomer units in the (meth) acrylic-based adhesive resin (b) is 100% by mass, more preferably 0.1% by mass or more and 15% by mass or less, even more preferably 0.1% by mass or more and 20% by mass or less, and particularly preferably 0.1% by mass or more and 5% by mass or less.

Examples of the polymerizable surfactant include a surfactant in which a polymerizable 1-propenyl group is introduced into a benzene ring of polyoxyethylene nonylphenyl ether (manufactured by Daiichi Kogyo Seiyaku Co., Ltd.; trade name: Aqualon RN-10, RN-20, RN-30, RN-50, and the like), a surfactant in which a polymerizable 1-propenyl group is introduced into a benzene ring of ammonium salt of sulfuric acid ester of polyoxyethylene nonylphenyl ether (manufactured by Daiichi Kogyo Seiyaku Co., Ltd.; trade name: Aqualon HS-10, HS-20, HS-1025, and the like), and a sulfosuccinate diester-based surfactant having a polymerizable double bond in the molecule (manufactured by Kao Corp.; trade name: Latemul S-120A, S-180A, and the like), or the like.

In the (meth)acrylic-based adhesive resin (b) according to the present embodiment, the content of the polymerizable surfactant is preferably 0.1% by mass or more and 30% by mass or less when the total of all monomer units in the (meth)acrylic-based adhesive resin (b) is 100% by mass, more preferably 0.1% by mass or more and 20% by mass or less, even more preferably 0.1% by mass or more and 15% by mass or less, and particularly preferably 0.1% by mass or more and 5% by mass or less.

The (meth)acrylic-based adhesive resin (b) according to the present embodiment may further contain a monomer unit formed of a monomer having a polymerizable double bond such as vinyl acetate, acrylonitrile, or styrene, as necessary.

Examples of the polymerization reaction mechanism of the (meth)acrylic-based adhesive resin (b) according to the present embodiment includes radical polymerization, anionic polymerization, cationic polymerization, and the like. In consideration of the manufacturing cost of the (meth)acrylic-based adhesive resin (b), the influence of functional groups of the monomer, the influence of ions on the surface of the electronic component, and the like, polymerization by radical polymerization is preferable.

When polymerizing by a radical polymerization reaction, examples of radical polymerization initiators include organic peroxides such as benzoyl peroxide, di-t-butyl peroxide, dicumyl peroxide, 3,3,5-trimethylhexanoyl peroxide, di-2-ethylhexylperoxy dicarbonate, methyl ethyl ketone peroxide, t-butylperoxyphthalate, t-butylperoxybenzoate, di-t-butylperoxyacetate, t-butylperoxyisobutyrate, t-butylperoxy-2-hexanoate, t-butylperoxy-2-ethylhexanoate, t-butylperoxy-3,5,5-trimethylhexanoate, acetyl peroxide, isobutyryl peroxide, octanoyl peroxide, t-butyl peroxide, and di-t-amyl peroxide; inorganic peroxides such as ammonium persulfate, potassium persulfate, and sodium persulfate; azo compounds such as 2,2'-azobisisobutyronitrile, 2,2'-azobis-2-methylbutyronitrile, and 4,4'-azobis-4-cyanovaleric acid.

In a case of polymerizing by an emulsion polymerization method, among these radical polymerization initiators, inorganic peroxides such as water-soluble ammonium persulfate, potassium persulfate, and sodium persulfate, and azo compounds having a carboxyl group in the molecule such as water-soluble 4,4'-azobis-4-cyanovaleric acid are preferable. Considering the influence of ions on the surface of the electronic components, ammonium persulfate and azo compounds having a carboxyl group in the molecule such as 4,4'-azobis-4-cyanovaleric acid are more preferable, and azo compounds having a carboxyl group in the molecule such as 4,4'-azobis-4-cyanovaleric acid are particularly preferable.

The adhesive resin layer (B) according to the present embodiment preferably further includes, in addition to the adhesive resin (B1), a cross-linking agent (B2) having two or more cross-linkable functional groups in one molecule.

The cross-linking agent (B2) having two or more cross-linkable functional groups in one molecule is used to react with the functional groups having the adhesive resin (B1) and adjust the adhesive force and cohesion force.

Examples of such cross-linking agents (B2) include epoxy-based compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether, and resorcinol diglycidyl ether; isocyanate-based compounds such as tetramethylene diisocyanate, hexamethylene diisocyanate, toluene diisocyanate 3 adduct of trimethylolpropane, polyisocyanate, diphenylmethane diisocyanate, and tolylene diisocyanate; aziridine-based compounds such as trimethylolpropane tri-β-aziridinyl propionate, tetramethylolmethane-tri-β-aziridinyl propionate, N,N'-diphenylmethane-4,4'-bis (1-aziridinecarboxyamide), N,N'-hexamethylene-1,6-bis(1-aziridinecarboxyamide), N,N'-toluene 2,4-bis(1-aziridinecarboxyamide), and trimethylolpropane-tri-β-(2-methylaziridine) propionate; tetrafunctional epoxy-based compounds such as N,N,N',N'-tetraglycidyl-m-xylenediamine, and 1,3-bis(N,N'-diglycidylaminomethyl)cyclohexane; melamine-based compounds such as hexamethoxymethylol melamine, and the like. These may be used alone or in a combination of two or more types.

Among the above, it is preferable to include one type or two or more types selected from epoxy-based compounds, isocyanate-based compounds, and aziridine-based compounds.

Usually, the content of the cross-linking agent (B2) is preferably in a range where the number of functional groups in the cross-linking agent (B2) does not exceed the number of functional groups in the adhesive resin (B1). However, in a case where new functional groups are created in the cross-linking reaction, in a case where the cross-linking reaction is slow, and the like, the content thereof may be greater as necessary.

The content of the cross-linking agent (B2) in the adhesive resin layer (B) is preferably 0.1 parts by mass or more and 10 parts by mass or less with respect to 100 parts by mass of the adhesive resin (B1), and more preferably 0.5 parts by mass or more and 5 parts by mass or less.

The adhesive resin layer (B) according to the present embodiment preferably includes an adhesion-imparting resin in addition to the adhesive resin (B1) from the viewpoint of improving the adhesion to the support substrate. Containing an adhesion-imparting resin in the adhesive resin layer (B) is preferable for facilitating adjustment of the adhesion to the support substrate near room temperature. An adhesion-imparting resin in which the softening point is 100° C. or higher is preferable. Specific examples of adhesion-imparting resins include rosin-based resins such as rosin-based derivatives treated by esterification or the like; terpene-based resins such as α-pinene, β-pinene, dipentene, and terpene phenol; natural rosins such as gum, wood, and tall oil; petroleum resins hydrogenated, disproportionated, polymerized, or maleated with these natural rosins; coumaron-indene resins, and the like.

Among these, examples having a softening point in the range of equal to or more than 100° C. and equal to or less than 160° C. are more preferable and examples having a softening point in the range of equal to or more than 120° C. and equal to or less than 150° C. are particularly preferable. Using an adhesion-imparting resin with a softening point within the above range not only minimizes contamination and glue residue on the support substrate, but also further improves adhesion to the support substrate in a working environment. Furthermore, when a polymerized rosin ester-based adhesion-imparting resin is used as the adhesion-imparting resin, not only are contamination and glue residue on the support substrate minimized, but also adhesion to the support substrate in an environment of equal to or more than 80° C. and equal to or less than 130° C. is improved, and in a case of a heat-expandable adhesive including heat-expandable microspheres, it is possible to more easily carry out the peeling from the support substrate after expansion of the heat-expandable microspheres.

The blending ratio of the adhesion-imparting resin may be appropriately selected such that it is possible to adjust the elastic modulus of the adhesive resin layer (B) within a predetermined numerical range as desired, without being particularly limited. However, in terms of the elastic modulus of the adhesive resin layer (B) and the initial peeling force, 1 to 100 parts by mass with respect to 100 parts by mass of the adhesive resin (B1) is preferable. When the blending ratio of the adhesion-imparting resin is the lower limit value described above or more with respect to 100 parts by mass of the adhesive resin (B1), there is a tendency for the adhesion to the support substrate during work to be favorable. On the other hand, when the blending ratio is the upper limit value described above or less, there is a tendency for the attachment property to the support substrate at room temperature to be favorable. In terms of the adhesion with the support substrate and the attachment property at room temperature, the blending ratio of the adhesion-imparting resin is preferably 2 to 50 parts by mass with respect to 100 parts by mass of the adhesive resin (B1). In addition, the acid value of the adhesion-imparting resin is preferably 30 or less. When the acid value of the adhesion-imparting resin is the upper limit value described above or less, there is a tendency for it to be difficult for glue residue to be left on the support substrate during peeling.

The adhesive resin layer (B) may include additives such as plasticizers as other components. When the entire adhesive resin layer (B) is 100% by mass, the total content of the adhesive resin (B1), the cross-linking agent (B2), and the adhesion-imparting resin in the adhesive resin layer (B) is preferably 50% by mass or more, more preferably 70% by mass or more, even more preferably 90% by mass or more, and particularly preferably 95% by mass or more. Furthermore, in a case where the adhesive resin layer (B) is formed of a heat-expandable adhesive, when the entire adhesive resin layer (B) is 100% by mass, the total content of the adhesive resin (B1), the cross-linking agent (B2), the adhesion-imparting resin, the gas generating component, and the heat-expandable microspheres in the adhesive resin layer (B) is preferably 50% by mass or more, more preferably 70% by mass or more, even more preferably 90% by mass or more, and particularly preferably 95% by mass or more.

The thickness of the adhesive resin layer (B) is not particularly limited, but, for example, is preferably 5 μm or more and 300 μm or less, and more preferably 20 μm or more and 150 μm or less.

It is possible to form the adhesive resin layer (B), for example, by a method of coating an adhesive coating solution on the base material layer 10, a method of transferring the adhesive resin layer (B) formed on a separator onto the base material layer 10, or the like.

As a method for coating the adhesive coating solution, it is possible to adopt a coating method known in the related art, for example, a roll coater method, a reverse roll coater method, a gravure roll method, a bar coating method, a comma coater method, a die coater method, or the like. The drying conditions of the coated adhesive are not particularly limited, but in general, it is preferable to perform the drying in a temperature range of equal to or more than 80° C. and equal to or less than 200° C. for 10 seconds to 10 minutes. More preferably, drying is performed at equal to or more than 80° C. and equal to or less than 170° C. for 15 seconds to 5 minutes. In order to sufficiently promote the cross-linking reaction between the cross-linking agent and the adhesive, after the drying of the adhesive coating solution is completed, heating may be carried out at equal to or more than 40° C. and equal to or less than 80° C. for approximately 5 to 300 hours.

In addition, the base material layer 10 and the adhesive resin layer (B) may be formed by co-extrusion molding or the film-like base material layer 10 and the film-like adhesive resin layer (B) may be formed by laminating.

Unevenness-Absorbing Resin Layer (C)

The adhesive film 50 according to the present embodiment has the unevenness-absorbing resin layer (C), which is able to be cross-linked by an external stimulus, between the base material layer 10 and the adhesive resin layer (A) or between the base material layer 10 and the adhesive resin layer (B).

The unevenness-absorbing resin layer (C) is a layer provided for the purpose of making the followability of the adhesive film 50 to the surface of the electronic component on which the uneven structure is formed favorable and making the adhesion between the uneven structure of the electronic component and the adhesive film 50 favorable. Furthermore, it is possible to increase the elastic modulus of the unevenness-absorbing resin layer (C) by cross-linking and curing the unevenness-absorbing resin layer (C) by an external stimulus. Due to this, it is possible to suppress the electronic component from sinking into the adhesive film in the electronic component sealing step.

Examples of external stimuli include heat or light.

The resin forming the unevenness-absorbing resin layer (C) is not particularly limited as long as the resin exhibits unevenness-absorbing properties, but for example, thermoplastic resins are preferable, and one type or two or more types selected from the group consisting of polyolefin-based resins, polystyrene-based resins, and (meth)acrylic-based resins is more preferable. Furthermore, a resin having a Shore D-type hardness of 50 or less is preferable according to ASTM D-2240 D-type Shore and 40 or less is more preferable.

Even in a case where the resin is not a thermoplastic resin, having the same unevenness-absorbing properties as above is preferable.

The unevenness-absorbing resin layer (C) preferably includes a cross-linkable resin. The unevenness-absorbing resin layer (C) including a cross-linkable resin makes it possible to more effectively cross-link the unevenness-absorbing resin layer (C) by an external stimulus and to further improve the elastic modulus of the unevenness-absorbing resin layer (C). Due to this, in the step of sealing the electronic component with the sealing material, it is possible to suppress softening of the unevenness-absorbing resin layer by heat and, as a result, it is possible to further suppress the sinking of the electronic component into the adhesive film 50 due to the pressure of the sealing material.

The cross-linkable resin according to the present embodiment is not particularly limited as long as it is a resin which is able to form the unevenness-absorbing resin layer (C) and which improves the elastic modulus by cross-linking by an external stimulus and, for example, it is possible to use one type or two or more types selected from olefin-based resins such as an ethylene α-olefin copolymer including ethylene and an α-olefin having 3 to 20 carbon atoms, high-density ethylene-based resins, low-density ethylene-based resins, medium-density ethylene-based resins, ultra-low density ethylene-based resins, linear low-density polyethylene (LLDPE) based resins, propylene (co)polymers, 1-butene (co)polymers, 4-methylpentene-1 (co)polymers, ethylene cyclic olefin copolymers, ethylene α-olefin cyclic olefin copolymers, ethylene α-olefin non-conjugated polyene copolymers, ethylene α-olefin conjugated polyene copolymers, ethylene aromatic vinyl copolymers, and ethylene α-olefin aromatic vinyl copolymers; ethylene carboxylic anhydride copolymers such as ethylene unsaturated carboxylic anhydride copolymers and ethylene α-olefin unsaturated carboxylic anhydride copolymers; ethylene epoxy-based copolymers such as ethylene epoxy-containing unsaturated compound copolymers, and ethylene α-olefin epoxy-containing unsaturated compound copolymers; ethylene (meth)acrylate ester copolymers such as ethylene ethyl (meth)acrylate copolymers, ethylene methyl (meth)acrylate copolymers, ethylene propyl (meth)acrylate copolymers, ethylene butyl (meth)acrylate copolymers, ethylene hexyl (meth)acrylate copolymers, ethylene-2-hydroxyethyl (meth)acrylate copolymers, ethylene-2-hydroxypropyl (meth)acrylate copolymers, and ethylene glycidyl (meth)acrylate copolymers; ethylene and ethylene-unsaturated acid copolymers such as ethylene (meth)acrylate copolymers, ethylene maleate copolymers, ethylene fumarate copolymers, and ethylene crotonate copolymers; ethylene vinyl ester copolymers such as ethylene vinyl acetate copolymers, ethylene vinyl propionate copolymers, ethylene vinyl butyrate copolymers, and ethylene vinyl stearate copolymers; ethylene styrene copolymers and the like; unsaturated carboxylic ester (co)polymers such as (meth)acrylic ester (co)polymers; ionomer resins such as ethylene acrylic acid metal salt copolymers and ethylene methacrylate metal salt copolymers; urethane-based resins; silicone-based resins; acrylic acid-based resins; methacrylic acid-based resins; cyclic olefin (co-)polymers; α-olefin, aromatic vinyl compound, and aromatic polyene copolymers; ethylene α-olefin aromatic vinyl compounds; aromatic polyene copolymers; ethylene, aromatic vinyl compound, and aromatic polyene copolymers; styrene-based resins; acrylonitrile, butadiene, and styrene copolymers; styrene conjugated diene copolymers; acrylonitrile styrene copolymers; acrylonitrile, ethylene, α-olefin, non-conjugated polyene, and styrene copolymers; acrylonitrile, ethylene, α-olefin, conjugated polyene, and styrene copolymers; methacrylic acid styrene copolymers; ethylene terephthalate resin; fluorine resins; polyester carbonate; polyvinyl chloride; polyvinylidene chloride; polyolefin-based thermoplastic elastomers; polystyrene-based thermoplastic elastomers; polyurethane-based thermoplastic elastomers; 1,2-polybutadiene-based thermoplastic elastomers; trans-polyisoprene-based thermoplastic elastomers; chlorinated polyethylene-based thermoplastic elastomers; liquid crystalline polyester; polylactic acid, and the like.

Among the above, since the thermal cross-linking or light cross-linking using cross-linking agents such as organic peroxides is easy, it is preferable to use one or two or more selected from olefin-based resins such as ethylene α-olefin copolymers formed of ethylene and α-olefins having 3 to 20 carbon atoms, low-density ethylene-based resins, medium-density ethylene-based resins, ultra-low density ethylene-based resins, linear low-density polyethylene (LLDPE) based resins, ethylene cyclic olefin copolymers, ethylene α-olefin cyclic olefin copolymers, ethylene α-olefin non-conjugated polyene copolymers, ethylene α-olefin conjugated polyene copolymers, ethylene aromatic vinyl copolymers, and ethylene α-olefin aromatic vinyl copolymers, ethylene unsaturated carboxylic anhydride copolymers, ethylene α-olefin unsaturated carboxylic anhydride copolymers, ethylene and epoxy-containing unsaturated compound copolymers, ethylene, α-olefin, and epoxy-containing unsaturated compound copolymers, ethylene vinyl acetate copolymers, ethylene unsaturated carboxylic acid copolymers such as ethylene acrylic acid copolymers, and ethylene methacrylic acid copolymers, and 1,2-polybutadiene-based thermoplastic elastomers.

It is more preferable to use one or two or more selected from ethylene α-olefin copolymers formed of ethylene and α-olefins having 3 to 20 carbon atoms, low-density ethylene-based resins, ultra-low density ethylene-based resins, linear low-density polyethylene (LLDPE) based resins, ethylene α-olefin non-conjugated polyene copolymers, ethylene α-olefin conjugated polyene copolymers, ethylene unsaturated carboxylic anhydride copolymers, ethylene α-olefin unsaturated carboxylic anhydride copolymers, ethylene epoxy-containing unsaturated compound copolymers, ethylene, α-olefin, and epoxy-containing unsaturated compound copolymers, ethylene vinyl acetate copolymers, ethylene-unsaturated carboxylic acid copolymers such as ethylene acrylic acid copolymers, and ethylene methacrylic acid copolymers.

It is even more preferable to use one or two or more selected from ethylene α-olefin copolymers formed of ethylene and α-olefins having 3 to 20 carbon atoms, low-density ethylene-based resins, ultra-low density ethylene-based resins, linear low-density polyethylene (LLDPE) based resins, ethylene α-olefin non-conjugated polyene copolymers, ethylene α-olefin conjugated polyene copolymers, ethylene vinyl acetate copolymers, ethylene-unsaturated carboxylic acid copolymers such as ethylene acrylic acid copolymers, and ethylene methacrylic acid copolymers.

Among the above, it is particularly preferable to use at least one selected from ethylene α-olefin copolymers and ethylene vinyl acetate copolymers. In the present embodiment, the resins described above may be used alone or used in a blend.

As the α-olefin of the ethylene α-olefin copolymer formed of ethylene and an α-olefin having 3 to 20 carbon atoms, which is used as the cross-linkable resin in the present embodiment, usually, it is possible to use one α-olefin having 3 to 20 carbon atoms alone or two or more in combination. Among the above, α-olefins having 10 or less carbon atoms are preferable, and α-olefins having 3 to 8 carbon atoms are particularly preferable. Examples of such α-olefins include propylene, 1-butene, 1-pentene, 1-hexene, 3-methyl-1-butene, 3,3-dimethyl-1-butene, 4-methyl-1-pentene, 1-octene, 1-decene, 1-dodecene, and the like. Among the above, propylene, 1-butene, 1-pentene, 1-hexene, 4-methyl-1-pentene, and 1-octene are preferable due to ease of availability. The ethylene α-olefin copolymer may be a random copolymer or a block copolymer, but a random copolymer is preferable from the viewpoint of flexibility.

As the unevenness-absorbing resin layer (C), it is also possible to use, for example, an ultraviolet-curable adhesive in which an ultraviolet-curable monomer component or an oligomer component is blended with a general adhesive.

Examples of general adhesives include (meth)acrylic-based adhesives, rubber-based adhesives, and the like. Among the above, (meth)acrylic-based adhesives with (meth)acrylic-based polymer as the base polymer are preferable.

Examples of ultraviolet-curable monomer components include urethane oligomers, urethane (meth)acrylates, trimethylolpropane tri(meth)acrylates, tetramethylolmethane tetra(meth)acrylates, pentaerythritol tri(meth)acrylates, pentaerythritol tetra(meth)acrylates, dipentaerythritol monohydroxypenta(meth)acrylates, dipentaerythritol hexa(meth)acrylate, 1,4-butanediol di(meth)acrylate, and the like. In addition, examples of ultraviolet-curable oligomer components include various oligomers such as urethane-based, polyether-based, polyester-based, polycarbonate-based, and polybutadiene-based oligomers, and the like.

The content of the ultraviolet-curable monomer component or oligomer component is, for example, 5 parts by mass or more and 500 parts by mass or less with respect to 100 parts by mass of a base polymer such as (meth)acrylic-based polymer forming the adhesive and preferably 40 parts by mass or more and 150 parts by mass or less.

In addition, as the unevenness-absorbing resin layer (C), as the base polymer, it is possible to use an ultraviolet-curable adhesive using a base polymer having a carbon-carbon double bond in the polymer side chain or in the main chain or at the end of the main chain.

As the base polymer having the carbon-carbon double bond described above, it is possible to use a base polymer having a carbon-carbon double bond and having adhesive properties. As such base polymers, base polymers having a (meth)acrylic-based polymer as the basic skeleton are preferable.

The method for introducing the unsaturated bond into the (meth)acrylic-based polymer is not particularly limited, but examples thereof include a method in which, after copolymerizing a monomer having a functional group in the (meth)acrylic-based polymer, a compound having a functional group and an unsaturated bond able to react with this functional group is subjected to condensation or an addition reaction while maintaining the ultraviolet-curing property of the unsaturated bond.

Examples of combinations of these functional groups include carboxylic acid groups and epoxy groups, carboxylic acid groups and aziridyl groups, hydroxyl groups and isocyanate groups, and the like. Among these combinations of functional groups, the combination of a hydroxyl group and an isocyanate group is preferable. A case where the (meth)acrylic-based polymer has hydroxyl groups and the compounds described above have isocyanate groups is preferable. Examples of isocyanate compounds with carbon-carbon double bonds include methacryloyl isocyanates, 2-methacryloyloxyethyl isocyanate, m-isopropenyl-α,α-dimethylbenzyl isocyanate, and the like. In addition, as (meth)acrylic-based polymers, it is possible to use copolymerized (meth)acrylic-based polymers with monomers containing hydroxy groups, and/or ether compounds such as 2-hydroxyethyl vinyl ether, 4-hydroxybutyl vinyl ether and diethylene glycol monovinyl ether, and the like.

For the ultraviolet-curable adhesive, it is also possible to blend the ultraviolet-curable monomer components and oligomer components described above. The content of the ultraviolet-curable monomer component or oligomer component is, for example, preferably 30 parts by mass or less with respect to 100 parts by mass of the base polymer and more preferably 10 parts by mass or less.

The ultraviolet-curable adhesive preferably includes a photopolymerization initiator. Examples of the photopolymerization initiator include α-ketol-based compounds such as 4-(2-hydroxyethoxy)phenyl (2-hydroxy-2-propyl)ketone, α-hydroxy-α,α'-dimethylacetophenone, 2-methyl-2-hydroxypropiophenone, and 1-hydroxycyclohexylphenyl ketone; acetophenone-based compounds such as methoxyacetophenone, 2,2-dimethoxy-2-phenylacetophenone, 2,2-diethoxyacetophenone, and 2-methyl-1-[4-(methylthio)-phenyl]-2-morpholinopropan-1; benzoin ether-based compounds such as benzoin ethyl ether, benzoin isopropyl ether, and anisoin methyl ether; ketal-based compounds such as benzyl dimethyl ketal; aromatic sulfonyl chloride-based compounds such as 2-naphthalenesulfonyl chloride; photoactive oxime-based compounds such as 1-pheneyl-1,1-propanedione-2-(o-ethoxycarbonyl)oxime; benzophenone-based compounds such as benzophenone, benzoylbenzoic acid, 3,3'-dimethyl-4-methoxybenzophenone; thioxansone-based compounds such as thioxansone, 2-chlorothioxansone, 2-methylthioxansone, 2,4-dimethylthioxansone, isopropylthioxansone, 2,4-dichlorothioxansone, 2,4-diethylthioxansone, and 2,4-diisopropylthioxansone; camphorquinone; halogenated ketones; acylphosphinoxides; acylphosphonates, and the like.

The blending amount of the photopolymerization initiator is preferably 0.1 parts by mass or more with respect to 100 parts by mass of the base polymer such as (meth)acrylic-based polymer forming the adhesive, and more preferably 0.5 parts by mass or more, and from the viewpoint of improving the shelf life of the adhesive, preferably 15 parts by mass or less and more preferably 5 parts by mass or less.

In the adhesive film 50 according to the present embodiment, taking the storage elastic modulus E' of the unevenness-absorbing resin layer (C) before cross-linking as an example, in a case where the cross-linking reaction does not occur at 100° C., the lower limit of the storage elastic modulus E' at 100° C. is preferably $1.0\times10^3$ Pa or higher in terms of being able to further suppress the sinking of electronic components into the adhesive film in the electronic component sealing step and more preferably $1.0\times10^4$ Pa or higher. Similarly, the upper limit of the storage elastic modulus E' at 100° C. is preferably $2.0\times10^5$ Pa or lower in terms of being able to further suppress position shifting of electronic components during the sealing step and more preferably $1.0\times10^5$ Pa or lower.

It is possible to control the storage elastic modulus E' of the unevenness-absorbing resin layer (C) before cross-linking within the range described above by controlling, for example, the type and blending ratio of each component forming the unevenness-absorbing resin layer (C).

In the adhesive film 50 according to the present embodiment, the lower limit of the storage elastic modulus E' at 125° C. of the unevenness-absorbing resin layer (C') obtained by cross-linking the unevenness-absorbing resin layer (C) is preferably $1.0\times10^6$ Pa or higher in terms of being able to further suppress the sinking of electronic components into the adhesive film in the electronic component sealing step and more preferably $5.0\times10^6$ Pa or higher.

In addition, in the adhesive film 50 according to the present embodiment, the upper limit of the storage elastic modulus E' at 125° C. of the unevenness-absorbing resin layer (C') is preferably $1.0\times10^9$ Pa or lower in terms of being able to further suppress position shifting of electronic components in the sealing step and more preferably $5.0\times10^8$ Pa or lower.

It is possible to control the storage elastic modulus E' at 125° C. of the unevenness-absorbing resin layer (C') within the range described above by controlling, for example, the type and blending ratio of each component forming the unevenness-absorbing resin layer (C).

The thickness of the unevenness-absorbing resin layer (C) is not particularly limited as long as the thickness is capable of embedding the uneven structure of the electronic component, but for example, 10 μm or more and 1000 μm or less is preferable, 20 μm or more and 900 μm or less is more preferable, 30 μm or more and 800 μm or less is even more preferable, and 50 μm or more and 700 μm or less is particularly preferable.

In a case where the uneven structure of the electronic component includes bump electrodes, when the height of the bump electrodes is defined as H [μm] and the thickness of the unevenness-absorbing resin layer (C) is defined as d [μm], H/d is preferably 1 or less, more preferably 0.85 or less, and even more preferably 0.7 or less. When H/d is the upper limit value described above or less, it is possible to make the unevenness-absorbing property more favorable while making the thickness of the adhesive film 50 thinner.

The lower limit of H/d is not particularly limited, but is, for example, 0.01 or more. The height of the bump electrodes is generally 2 μm or more and 600 μm or less.

Other Layers

The adhesive film 50 according to the present embodiment may further be provided with, for example, an easy-adhesion layer or the like between each layer in a range in which the effects of the present embodiment are not impaired.

A description was given above of the embodiments of the present invention, but these are examples of the present invention and it is also possible to adopt various configurations other than the above.

Here, the present invention is not limited to the embodiments described above and modifications, improvements, and the like in a range in which it is possible to achieve the object of the present invention are included in the present invention.

This application claims priority based on Japanese Patent Application No. 2020-061027 filed on Mar. 30, 2020, the entire disclosure of which is incorporated herein.

REFERENCE SIGNS LIST

A: Adhesive resin layer
B: Adhesive resin layer
C: Unevenness-absorbing resin layer
C': Unevenness-absorbing resin layer
10: Base material layer
10A: First surface
10B: Second surface
50: Adhesive film
50A: Adhesive film
60: Sealing material
60A: Sealing material
70: Electronic component
70A: Electronic component
75: Uneven structure
75A: Uneven structure
80: Support substrate
80A: Support substrate
90: Stand-off
100: Structure
200: Electronic device
300: Electronic device
310: Wiring layer
320: Bump
400: Electronic device

The invention claimed is:

1. A method for manufacturing an electronic device, the method comprising at least:
a preparing step of preparing a structure provided with an adhesive film provided with a base material layer, an adhesive resin layer (A) provided on a first surface side of the base material layer and used for temporarily fixing an electronic component, an adhesive resin layer (B) provided on a second surface side of the base material layer, and an unevenness-absorbing resin layer (C) provided between the base material layer and the adhesive resin layer (A) or between the base material layer and the adhesive resin layer (B), and which is able to be cross-linked by an external stimulus, and an electronic component attached to the adhesive resin layer (A) of the adhesive film and having an uneven structure;
a cross-linking step of cross-linking the unevenness-absorbing resin layer (C) by applying an external stimulus to the unevenness-absorbing resin layer (C) in the structure; and
a sealing step of sealing the electronic component with a sealing material,
wherein a storage elastic modulus E' of an unevenness-absorbing resin layer (C') obtained by cross-linking the unevenness-absorbing resin layer (C) at 125° C. is $1.0\times10^6$ Pa or higher and $1.0\times10^9$ Pa or lower.

2. The method for manufacturing an electronic device according to claim 1,
wherein the adhesive resin layer (B) is a layer for which an adhesive force is reduced by an external stimulus.

3. The method for manufacturing an electronic device according to claim 1,
wherein the external stimulus is heat or light.

4. The method for manufacturing an electronic device according to claim 1,
wherein the unevenness-absorbing resin layer (C) is provided at least between the base material layer and the adhesive resin layer (A).

5. The method for manufacturing an electronic device according to claim 1,
wherein the uneven structure of the electronic component includes a bump electrode.

6. The method for manufacturing an electronic device according to claim 5,
wherein, when a height of the bump electrode is H [μm] and a thickness of the unevenness-absorbing resin layer is d [μm], H/d is 0.01 or more and 1 or less.

7. The method for manufacturing an electronic device according to claim 1,
wherein the unevenness-absorbing resin layer (C) includes a cross-linkable resin.

8. The method for manufacturing an electronic device according to claim 1,
wherein a thickness of the unevenness-absorbing resin layer (C) is 10 μm or more and 1000 μm or less.

9. The method for manufacturing an electronic device according to claim 1,
wherein the structure is further provided with a support substrate attached to the adhesive resin layer (B).

10. The method for manufacturing an electronic device according to claim 9, further comprising:
a first peeling step of peeling the support substrate from the structure by reducing an adhesive force of the adhesive resin layer (B) by applying an external stimulus, after the sealing step.

11. The method for manufacturing an electronic device according to claim 10, further comprising:
a second peeling step of peeling the adhesive film from the electronic component after the first peeling step.

12. The method for manufacturing an electronic device according to claim 1,
wherein the sealing material is an epoxy resin-based sealing material.

13. The method for manufacturing an electronic device according to claim 1,
wherein an adhesive resin forming the adhesive resin layer (A) includes one or two or more types selected from (meth)acrylic-based adhesive resin, silicone-based adhesive resin, urethane-based adhesive resin, olefin-based adhesive resin, and styrene-based adhesive resin.

* * * * *